United States Patent
Tanaka et al.

(10) Patent No.: US 10,185,219 B2
(45) Date of Patent: Jan. 22, 2019

(54) DEVELOPING METHOD

(71) Applicant: SCREEN Holdings Co., Ltd., Kyoto (JP)

(72) Inventors: Yuji Tanaka, Kyoto (JP); Tadashi Miyagi, Kyoto (JP); Masahiko Harumoto, Kyoto (JP); Koji Kaneyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 230 days.

(21) Appl. No.: 14/979,651

(22) Filed: Dec. 28, 2015

(65) Prior Publication Data

US 2016/0195811 A1 Jul. 7, 2016

(30) Foreign Application Priority Data

Jan. 7, 2015 (JP) ................................. 2015-001581

(51) Int. Cl.
| | | |
|---|---|---|
| *G03F 7/30* | (2006.01) | |
| *B05D 3/12* | (2006.01) | |
| *B05D 1/00* | (2006.01) | |
| *H01L 21/67* | (2006.01) | |

(52) U.S. Cl.
CPC ............ *G03F 7/3021* (2013.01); *B05D 1/005* (2013.01); *H01L 21/6715* (2013.01)

(58) Field of Classification Search
CPC .... G03F 7/3021; H01L 21/6715; B05D 1/005
USPC .......................................... 427/240; 430/434
See application file for complete search history.

(56) References Cited

U.S. PATENT DOCUMENTS

| | | | | |
|---|---|---|---|---|
| 2004/0071872 A1* | 4/2004 | Kawase | .............. | H01L 21/6715 427/240 |
| 2005/0063699 A1 | 3/2005 | Lin et al. | ....................... | 396/611 |
| 2006/0048792 A1 | 3/2006 | Nakamura et al. | ............... | 134/2 |
| 2009/0035021 A1* | 2/2009 | Yamamoto | ............ | G03F 7/3021 399/222 |

(Continued)

FOREIGN PATENT DOCUMENTS

| | | |
|---|---|---|
| JP | 09-152718 A | 6/1997 |
| JP | 2000-147787 A | 5/2000 |

(Continued)

OTHER PUBLICATIONS

Office Action dated Sep. 9, 2016 for corresponding Korean Patent Application No. 10-2016-0001090.

(Continued)

*Primary Examiner* — Kirsten Jolley
(74) *Attorney, Agent, or Firm* — Ostrolenk Faber LLP (57) ABSTRACT

In a developing method, a developing nozzle starts discharge of developer to a position set in advance on a substrate, spinning about the center thereof, away from the center. This causes a flow of the developer at the center having a small centrifugal force immediately after the discharge is started. Accordingly, a dissolution product of a resist can be ejected outside the substrate more efficiently than the case when the discharge of the developer to the center is started. Moreover, this achieves distributed arrival positions of the developer directly discharged from the developing nozzle immediately after the discharge is started. Consequently, thin resist patterns especially at the center of the substrate are eliminated to obtain suppression in treatment variation.

6 Claims, 9 Drawing Sheets

(56) References Cited

U.S. PATENT DOCUMENTS

| | | | |
|---|---|---|---|
| 2009/0103960 A1 | 4/2009 | Harumoto et al. | 399/377 |
| 2009/0130614 A1 | 5/2009 | Ookouchi et al. | 430/434 |
| 2009/0272407 A1 | 11/2009 | Nakamura et al. | 134/18 |
| 2009/0311632 A1 | 12/2009 | Takeguchi et al. | 430/322 |
| 2010/0203250 A1 | 8/2010 | Sato et al. | 427/402 |
| 2010/0233637 A1 | 9/2010 | Arima et al. | 430/325 |
| 2016/0026087 A1* | 1/2016 | Iseki | G03F 7/32 430/434 |

FOREIGN PATENT DOCUMENTS

| | | |
|---|---|---|
| JP | 2005-210059 A | 8/2005 |
| JP | 2006-253515 A | 9/2006 |
| JP | 2009-099851 A | 5/2009 |
| JP | 2009-231617 | 10/2009 |
| JP | 2009-231617 A | 10/2009 |
| JP | 2009-231618 A | 10/2009 |
| JP | 2009-231619 | 10/2009 |
| JP | 2009-231619 A | 10/2009 |
| JP | 2009-302433 A | 12/2009 |
| JP | 2010-182931 A | 8/2010 |
| TW | I230974 | 4/2005 |
| TW | I275142 | 3/2007 |
| TW | 201033759 A1 | 9/2010 |
| TW | 201341982 A | 10/2013 |

OTHER PUBLICATIONS

Office Action and Search Report dated Mar. 7, 2017 for corresponding Taiwan Patent Application No. 105100269.
Office Action dated Nov. 6, 2018 for corresponding Japanese Patent Application No. 2015-001581.

* cited by examiner

DEVELOPING METHOD

CROSS-REFERENCE TO RELATED APPLICATIONS

This application claims priority to Japanese Patent Application No. 2015-001581 filed Jan. 7, 2015 the subject matter of which is incorporated herein by reference in entirety.

TECHNICAL FIELD

The present invention relates to a developing method for developing substrates such as semiconductor wafers, glass substrates for liquid crystal display, glass substrate for photomask, and optical disk substrates.

BACKGROUND ART

Examples of currently-used substrate treating apparatus include a developing apparatus. The developing apparatus performs a developing process by supplying developer to a substrate having a photoresist film formed thereon and to which given patterns are exposed. The developing apparatus includes a spin holder for spinning a substrate in a substantially horizontal attitude about a vertical axis, and nozzles supplying prewet liquid, developer, or rinse liquid onto the substrate (see, for example, Japanese Patent Publications 2009-231617A and 2009-231619A). Discharge of the prewet liquid, the developer, or the rinse liquid is started to the center of the substrate W.

SUMMARY OF INVENTION

Technical Problem

When a photoresist (hereinafter, referred to as a "resist") is treated with the developer, the resist is partially dissolved, and a dissolution product of the resist may be contaminated into the developer. The above spinnable developing apparatus discharges fresh developer to the center of the substrate. Spinning the substrate achieves uniform spread of the developer while ejecting developer, having the dissolution product contaminated thereinto, from an outer edge of the substrate. That is, the dissolution product is ejected outside the substrate by discharging the fresh developer.

The currently-used developing method mentioned above possesses the following drawbacks. Firstly, the dissolution product as the cause of defective development may be ejected (i.e., cleaned) unsatisfactorily. For instance, a dissolution product between two resist patterns may cause defective development that bridges the two resist patterns. Such a drawback has become evident from the following. That is, the defective development that influences device performance is reduced in size as resist patterns are micronized, and thus a size for testing of the defective development becomes more precise than before. Accordingly, satisfactory ejection of the dissolution product of the resist needs adjustment of a flow rate of the developer to be discharged, and pressure and time for discharging the developer. Moreover, scan of developing nozzle is needed.

Figure 1:
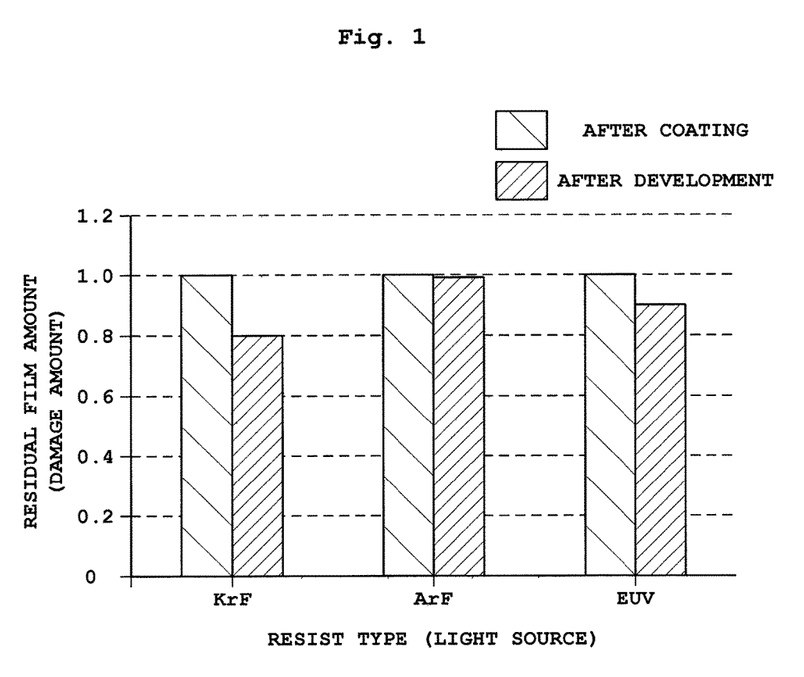
FIG. 1 illustrates a relationship between a resist type corresponding to a light source and a residual film amount.

Secondarily, the following drawback may arise. That is, if higher priority is given to an ejection effect of the dissolution product to discharge the developer to the center of the substrate continuously for a long period of time, resist patterns becomes thinner from the outer edge toward the center of the substrate. Especially, the resist patterns are remarkably thin at the center of the substrate. As illustrated in FIG. 1, the resist patterns become thin differently depending on types of the resist. FIG. 1 illustrates a relationship between resist types, corresponding to a light source, and a residual film amount. In this drawing, a ratio of a residual film thickness after development is illustrated assuming that a coated film has a thickness of 1.0. The film thickness is compared with an average value of an entire film surface.

When the prewet liquid or the rinse liquid is discharged, air bubbles in the liquid at the center of the substrate may remain on the substrate since the center of the substrate has a small centrifugal force. For the prewet liquid, unsatisfactory development may occur at a portion of the substrate on which the air bubbles remains. Moreover, for the rinse liquid, an unsatisfactory rinse treatment may occur at the portion of the substrate on which the air bubbles remains.

The present invention has been made regarding the state of the art noted above, and its one object is to provide a developing method that allows ejection of a dissolution product outside a substrate with enhanced efficiency for suppression in treatment variation.

Solution to Problem

The present invention is constituted as stated below to achieve the above object. One aspect of the present invention provides a developing method for performing development to a substrate. The developing method includes a spinning step of spinning the substrate about the center of the substrate with a spin holder; a discharge starting step of starting discharge of developer through a developing nozzle to a first position set in advance on the spinning substrate away from the center; and a coating step of coating the center with spread of the developer discharged on the first position.

With the developing method according to the above aspect of present invention, the developing nozzle start discharge of the developer to the first position set in advance on the substrate, spinning about the center thereof, away from the center. This causes a flow of the developer at the center having a small centrifugal force immediately after the discharge is started. Accordingly, a dissolution product of a resist can be ejected outside the substrate more efficiently than the case when the discharge of the developer to the center is started. Moreover, this achieves distributed arrival positions of the developer directly discharged from the developing nozzle immediately after the discharge is started. Consequently, thin resist patterns especially at the center of the substrate are eliminated to obtain suppression in treatment variation.

Moreover, the center is coated with the spread of the developer discharged on the first position. This allows development at the center even when the developer is discharged directly to a position away from the center.

Moreover, it is preferred that the developing method further includes a moving step of moving the developing nozzle with a nozzle moving unit toward an outer edge of the substrate while the developing nozzle discharge the developer after the coating step of coating the center with the spread of the developer. Here, a position on the substrate to which the developing nozzle perform direct discharge is moved, whereby a force is applied that is different from the developer flowing due to the centrifugal force. This yields satisfactory ejection of the dissolution product.

Moreover, it is preferred that the developing method further includes a discharge starting step of starting discharge of prewet liquid through a prewet nozzle to a second position set in advance on the spinning substrate away from the center, and a coating step of coating the center with spread of the prewet liquid discharged on the second position. It is also preferred that the discharge starting step of starting the discharge of the developer is performed after the discharge of the prewet liquid is stopped.

This allows flow of the prewet liquid at the center having a small centrifugal force immediately after the prewet liquid is discharged. Accordingly, air bubbles in the prewet liquid can be ejected outside the substrate more efficiently than the case when the discharge of the prewet liquid to the center is started. This yields prevention of defective development caused by residual air bubbles. Moreover, the center is coated with the spread of the prewet liquid discharged on the second position. This allows a pre-wet treatment to the center even when the prewet liquid is directly discharged to a position away from the center.

Moreover, it is preferred that the developing method further includes a discharge starting step of starting discharge of rinse liquid through a rinse nozzle to a third position set in advance on the spinning substrate away from the center after the discharge of the developer is stopped, and a coating step of coating the center with spread of the rinse liquid discharged on the third position.

This causes a flow of the rinse liquid at the center having a small centrifugal force immediately after the discharge is started. Accordingly, air bubbles can be ejected outside the substrate more efficiently than the case when the discharge of the rinse liquid to the center is started, leading to prevention of an unsatisfactory rinse treatment. Moreover, the center is coated with the spread of the rinse liquid discharged on the third position. This yields a rinse treatment to the center even when the rinse liquid is directly discharged to the position away from the center.

Moreover, examples of the developing nozzle in the developing method include one having discharge ports arranged in line. Such a configuration allows wide discharge of the developer, allowing rapid application of the developer to an entire substrate surface.

Advantageous Effects of Invention

With the developing method according to the aspects of present invention, the developing nozzle starts the discharge of the developer to the first position set in advance on the substrate, spinning about the center thereof, away from the center. This causes a flow of the developer at the center having a small centrifugal force immediately after the discharge is started. Accordingly, a dissolution product of a resist can be ejected outside the substrate more efficiently than the case when the discharge of the developer to the center is started. Moreover, this achieves distributed arrival positions of the developer directly discharged from the developing nozzle immediately after the discharge is started. Consequently, thin resist patterns especially at the center of the substrate are eliminated to obtain suppression in treatment variation.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

Figure 2:
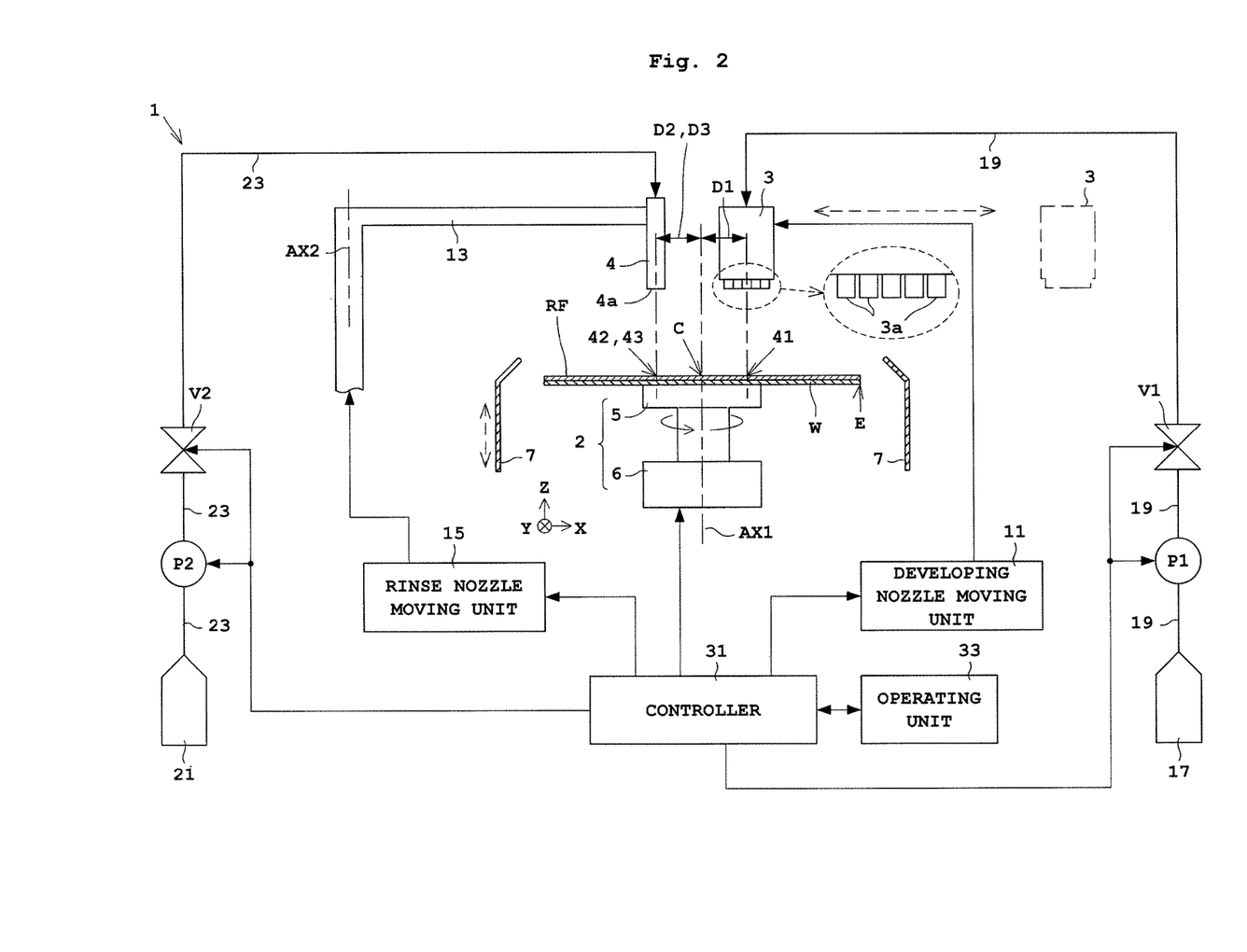
FIG. 2 is a block diagram illustrating a developing apparatus according to one embodiment of the present invention.
Figure 3:
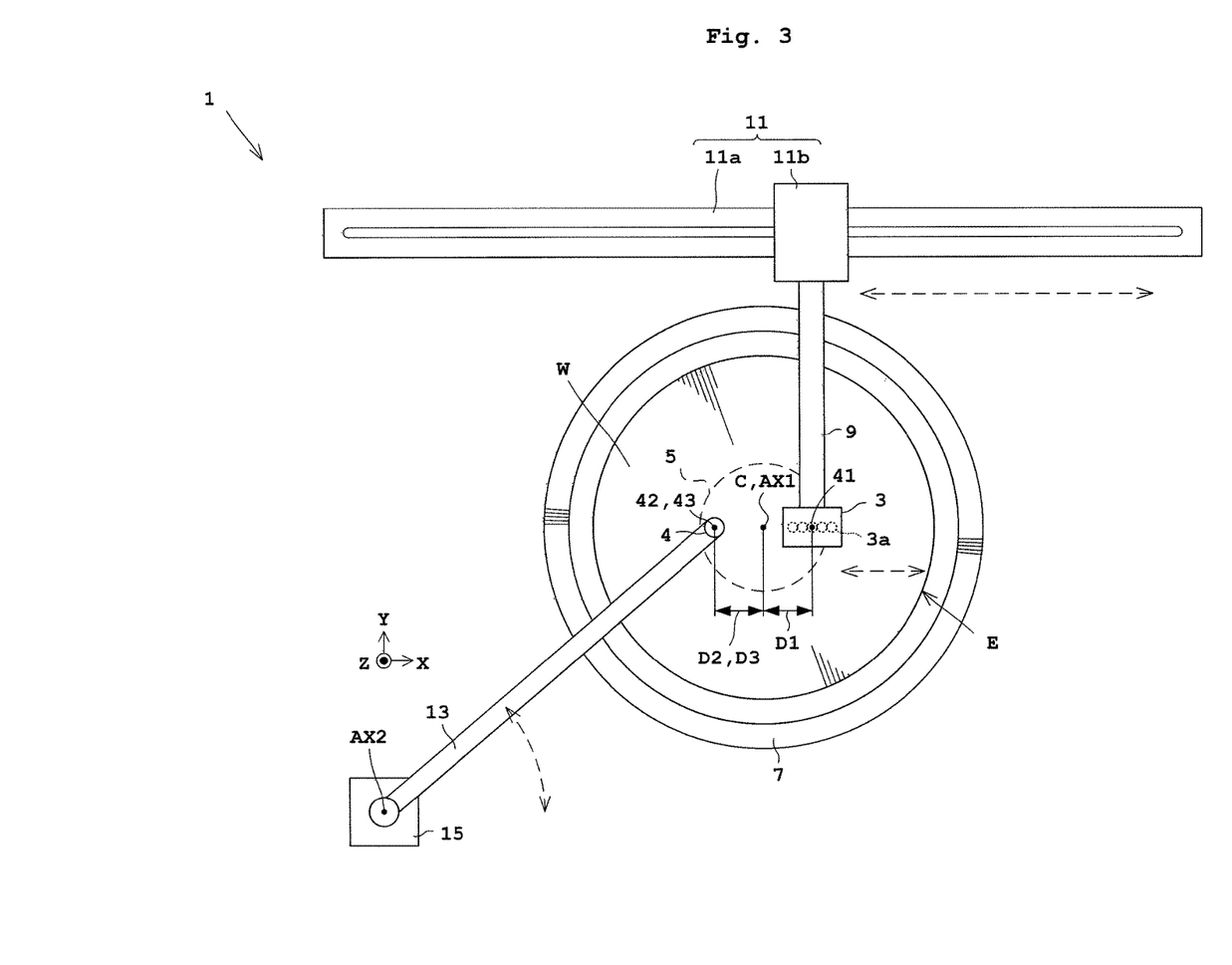
FIG. 3 is a plan view of the developing apparatus according to the embodiment.

The following describes embodiments of the present invention with reference to drawings. FIG. 2 is a schematic block diagram of a developing apparatus according to one embodiment of the present invention. FIG. 3 is a plan view of the developing apparatus according to the embodiment.

Configuration of Developing Apparatus

Reference is made to FIG. 2. A developing apparatus 1 includes a spin holder 2 that holds a substrate W in a substantially horizontal attitude, a developing nozzle 3 that discharges developer, and a rinse nozzle 4 that discharges rinse liquid. Here, the rinse nozzle 4 corresponds to the rinse nozzle and the prewet nozzle in the present invention.

The spin holder 2 includes a spin chuck 5 that holds the rotatably substrate W spinnably about a vertical axis AX1, and a rotary drive unit 6 that rotates the spin chuck 5 about the vertical axis AX1. The spin chuck 5 suction-holds a rear face of the substrate W, thereby holding the substrate W. The rotary drive unit 6 is formed by a motor and the like. The rotary shaft AX1 substantially conforms to the center C of the substrate W when seen the substrate from above.

A cup 7 is provided lateral to the spin holder 2 for surrounding the spin holder 2. The cup 7 is moved vertically by a drive unit, not shown.

The developing nozzle 3 includes a plurality of (e.g., five) discharge ports 3a disposed in line along an X-direction as a moving direction. See an enlarged part in FIGS. 2 surrounded by dotted lines. This achieves wide discharge of the developer and thus rapid application of the developer over the entire surface of the substrate W. The rinse nozzle 4 includes one discharge port 4a.

The developing nozzle 3 is supported by an arm 9. A developing nozzle moving unit 11 moves the developing nozzle 3 via the arm 9 to a given position and a given level. As illustrated in FIG. 3, the developing nozzle moving unit 11 includes a horizontal moving unit 11a that moves the developing nozzle 3 in the X-direction, and a lifting member 11b that moves the developing nozzle 3 in a Z-direction. The horizontal moving unit 11a holds the lifting member 11b in such a way that the lifting member 11b is movable in the X-direction. The lifting member 11b supports the arm 9.

As illustrated in FIG. 3, the arm 13 supports the rinse nozzle 4. A rinse nozzle moving unit 15 moves the rinse nozzle 4 via the arm 13 to a given position and a given level.

That is, the rinse nozzle moving unit 15 rotates the rinse nozzle 4 about a vertical axis AX2, and moves the rinse nozzle 4 upward/downward in the Z-direction. The rinse nozzle moving unit 15 holds the arm 13 in such a way that the arm 13 is rotatable about the vertical axis AX2 and is movable in the Z-direction.

The horizontal moving unit 11a, the lifting member 11b, and the rinse nozzle moving unit 15 are each formed by a motor and the like. The developing nozzle 3 may rotate about the vertical axis in such a way as the rinse nozzle moving unit 15. Moreover, the rinse nozzle 4 may be movable in the X-direction in such a way as the horizontal moving unit 11a. Moreover, the horizontal moving unit 11a may be movable in at least either the X-direction or a Y-direction.

Now reference is made back to FIG. 2. A developer supplying source 17 supplies the developer to the developing nozzle 3 through a developer pipe 19. The developer pipe 19 has an open/close valve V1 and a pump P1 interposingly arranged thereon. The open/close valve V1 supplies the developer and stops supply of the developer. The pump P1 feeds the developer to the developing nozzle 3.

A rinse liquid supplying source 21 supplies the rinse liquid to the rinse nozzle 4 through a rinse liquid pipe 23. The rinse liquid pipe 23 has an open/close valve V2 and a pump P2 interposingly arranged thereon. The open/close valve V2 supplies the rinse liquid and stops supply of the rinse liquid. The pump P2 feed the rinse liquid to the rinse nozzle 4. Here in the present embodiment, since the rinse liquid and the prewet liquid are the same, the rinse nozzle 4 also discharges the prewet liquid.

The developing apparatus 1 further includes a controller 31, and an operating unit 33. The controller 31 is formed by a central processing unit (CPU). The operating unit 33 operates the developing apparatus 1. The controller 31 controls every unit of the developing apparatus 1. The operating unit 33 includes a display unit such as a liquid crystal monitor, a memory unit such as a ROM (Read-only Memory), a RAM (Random-Access Memory), and a hard disk, and an input unit such as a keyboard, a mouse, a button, and the like. The memory unit stores various conditions for the development.

Operation of Developing Apparatus

The following describes operation of the developing apparatus 1. In the present embodiment, as illustrated in FIG. 2, the developing nozzle 3 starts discharge of the developer to a position 41 set in advance on the substrate W spinning about the center C (vertical axis AX1) away from the center C. This generates a flow of the developer at the center C with a small centrifugal force immediately after the discharge is started. Accordingly, a dissolution product of a resist can be ejected outside the substrate W more efficiently than that when discharge of the developer the center C is started at. In addition, this achieves distributed arrival positions to which the developer directly discharged from the developing nozzle 3 immediately after the discharge is started. Consequently, thin resist patterns especially at the center C of the substrate W are eliminated.

Moreover, the center C is coated with spread of the developer discharged on the position 41. This allows development of the center C even when the developer is discharged directly to the position 41 away from the center C. In contrast to this, when the center C cannot be coated with spread of the developer discharged on the position 41, development of the center C is not performable.

Here, the position 41 corresponds to the first position in the present invention. A position 42 to be mentioned later corresponds to the second position in the present invention. A position 43 to be mentioned later corresponds to the third position in the present invention.

Figure 4:
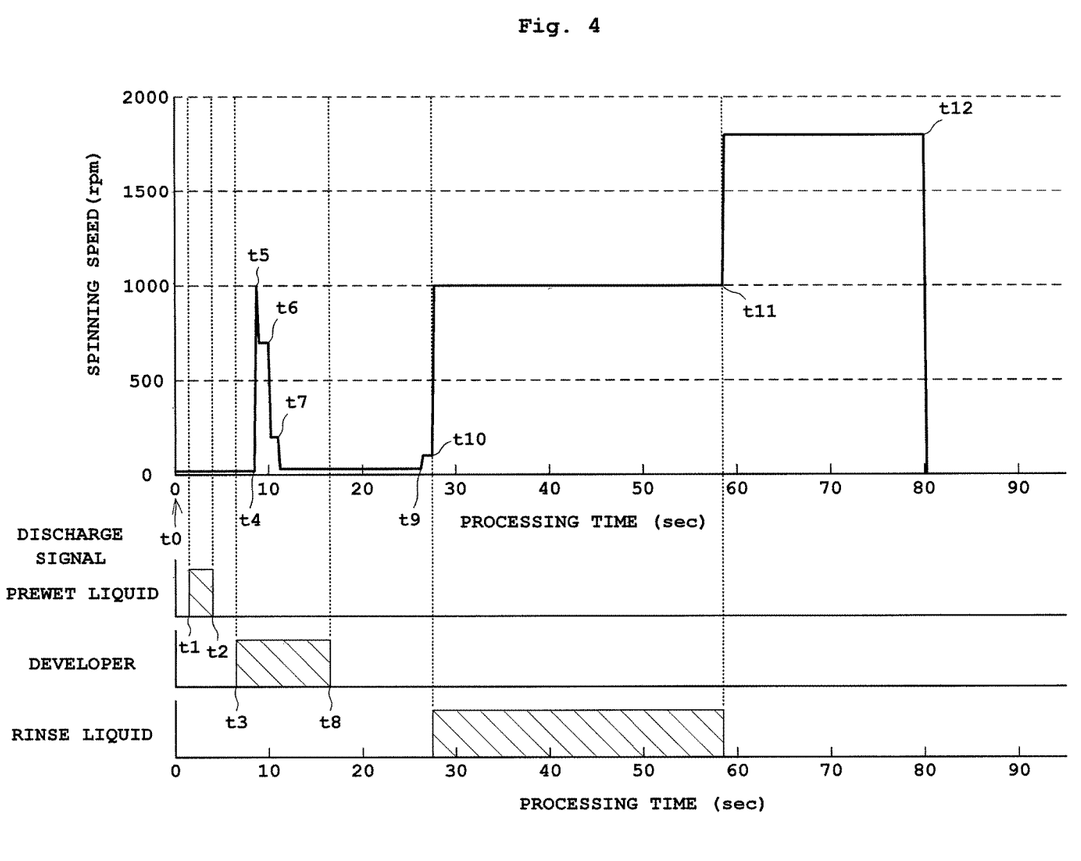
FIG. 4 illustrates a developing step with one example of a spinning speed of a substrate and discharge timings of various types of processing liquid.

FIG. 4 illustrates a developing step with one example of a spinning speed of the substrate W and discharge timings of the various types of the processing liquid. In the present embodiment, the developing step includes a pre-process (t0 to t3), a main developing process (t3 to t10), and a cleaning process (t10 to t12). The main developing process (t3 to t10) includes a developer discharging process (t3 to t8) and a time adjustment process (t8 to t10).

Here in the present embodiment, the rinse liquid is used as the prewet liquid. For instance, pure water such as deionized water (DIW) is used. Accordingly, the rinse nozzle 4 discharges the prewet liquid. Moreover, in FIGS. 5A and 5E and FIGS. 6A to 6D, the prewet liquid is denoted by a numeral Lpre, the developer by a numeral Ldev, and the rinse liquid by a numeral Lrin.

In FIG. 2, a transporting robot, not shown, transports the substrate W onto the spin holder 2. A photoresist film RF to which given patterns are exposed is formed on the substrate W. The spin holder 2 holds a rear face of the substrate W. In FIG. 3, illustration of the resist film RF is omitted.

The spin holder 2 spins the substrate W about the center C of the substrate W at a pre-process start time t0 in FIG. 4. The substrate W spins at approximately 20 rpm. The rinse nozzle moving unit 15 moves the rinse nozzle 4 from a standby position outside the cup 7 to a given position above the substrate W. That is, the rinse nozzle moving unit 15 moves the rinse nozzle 4 to the position 42 set in advance above the substrate W away from the center C by a distance D2 (see FIG. 3).

Figure 5A:
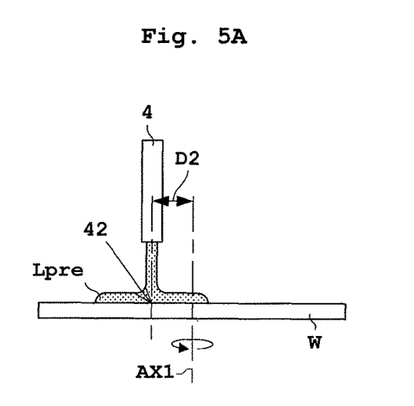
FIGS. 5A and 5B each illustrate pre-process.
Figure 5B:
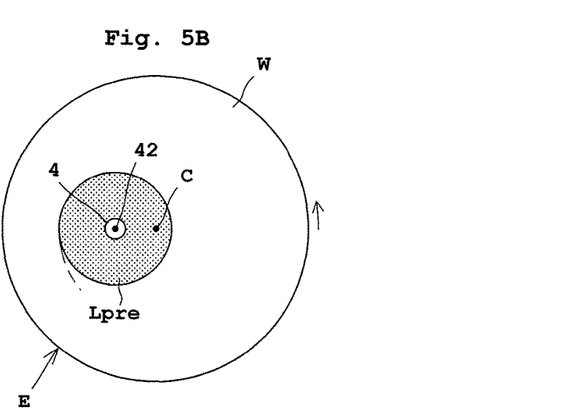

The rinse nozzle 4 starts discharge of the prewet liquid to the spinning substrate W (strictly speaking, on the resist film) at a time t1. That is, as illustrated in FIGS. 5A and 5B, the rinse nozzle 4 starts the discharge of the prewet to the position 42 set in advance away from the center C of the substrate W. Here, the center C is coated with spread of the prewet liquid discharged on the position 42. The prewet liquid discharged on the substrate W is outside the center C. Accordingly, the prewet liquid flows from outside the center C toward the center C immediately after the discharge is started. As noted above, a flow is generated immediately after the discharge is started. Consequently, this yields more efficient removal of air bubbles from the center C to which a centrifugal force is unlikely to be applied than the case when the prewet liquid is directly discharged to the center C.

The following describes why the air bubbles remain around the center C. The air bubbles are pressed from above toward the substrate W at a position where the prewet liquid is directly discharged. If the pressed position is the center C, the air bubbles are pressed at the same position. A centrifugal force is small around the center C. From the above, the air bubbles on the substrate W are likely to remain at the center C. The same is applicable to the developer and the rinse liquid.

The rinse nozzle 4 stops the discharge of the prewet liquid at a time t2. Then, the rinse nozzle moving unit 15 moves the rinse nozzle 4 from above the substrate W to the standby position. Here, the rinse nozzle 4 may stay remained for performing the cleaning process (t10 to t12). Moreover, the developing nozzle moving unit 11 moves the developing nozzle from the standby position outside the cup 7 to a given position above the substrate W. The developing nozzle moving unit 11 moves the developing nozzle 3 to the position 41 set in advance above the substrate W away from the center C by a distance D1 (see FIG. 3).

The prewet liquid on the substrate W spreads from the center C to an outer edge E of the substrate W, and remains on the substrate W. Redundant prewet liquid on the substrate W may be ejected outside the substrate W.

Figure 5C:
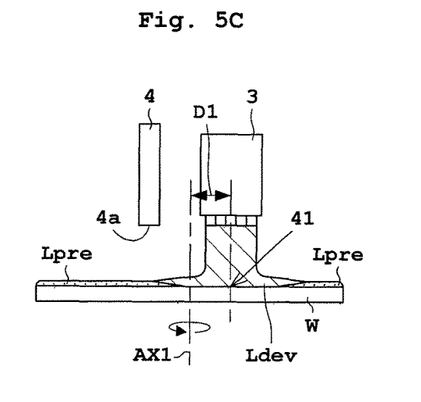
FIGS. 5C to 5E each illustrate a main developing step.
Figure 5D:
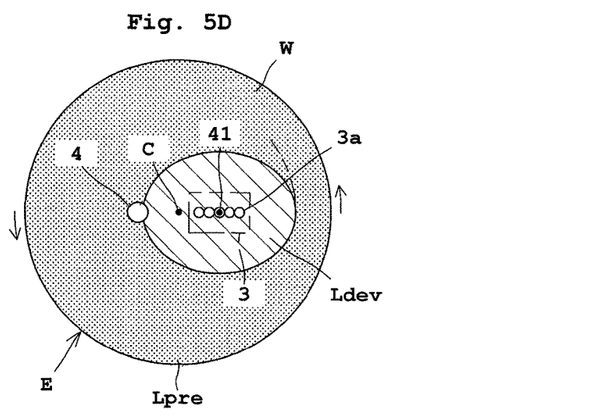

The developing nozzle 3 starts the discharge of the developer to the spinning substrate W at a main developing step starting time t3. That is, as illustrated in FIGS. 5C and 5D, the developing nozzle 3 starts the discharge of the developer to the position 41 set in advance away from the center C of the substrate W. Since the prewet liquid causes enhanced wettability of the substrate W, the developer reached on the substrate W is likely to spread. Moreover, direct discharge of the developer to the resist film causes a speed-up reaction at a portion where the developer contacts depending on types of the resist. This generates spiral unevenness. However, when the developer is applied via the prewet liquid, a reaction is relieved to suppress the above unevenness.

The prewet liquid is gradually replaced with the developer. Since the developer already reached on the substrate W, given patterns on the resist film with the developer are dissolved to generate a dissolution product in the developer.

Figure 5E:
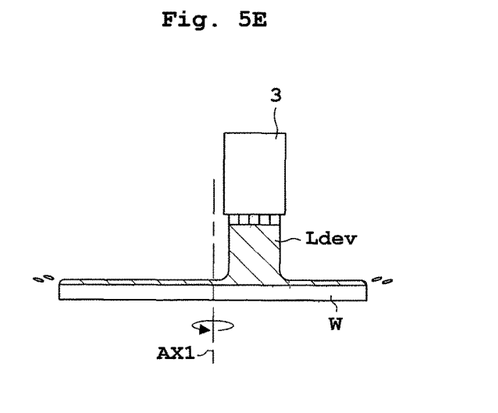

The spin holder 2 increases a spinning speed of the substrate W to approximately 1000 rpm at a time t4. Consequently, as illustrated in FIG. 5E, the developer is ejected outside the substrate W. This yields efficient ejection of the generated dissolution product of the photoresist outside the substrate W. Then, the spin holder 2 decreases the spinning speed of the substrate W to approximately 700 rpm at a time t5. Moreover, the developing nozzle 3 discharges the developer at the time t5 while the developing nozzle moving unit 11 moves the developing nozzle 3 from the position 41 toward the outer edge E of the substrate W as in FIG. 6A. In addition, new developer is discharged while the current developer is ejected outside the substrate W. Consequently, the dissolution product is removed to be replaced with the new developer.

In the present embodiment, the developer, the prewet liquid, and the rinse liquid started to be discharged to the position away from the center C each do not flow in a river or streak shape but flow in such a way to spread substantially over the surface of the substrate W through spin, and thereafter are ejected outside the substrate W.

The spin holder 2 decreases the spinning speed of the substrate W to approximately 200 rpm at a time t6. The developing nozzle 3 discharges the developer at the time t6 while the developing nozzle moving unit 11 moves the developing nozzle 3 from a position adjacent to the outer edge E to the position 41. In other words, the developing nozzle 3 is scanned reciprocatedly in a radial direction of the substrate W from the time t5 to the time t7. Here, the substrate W spins at a low speed, and accordingly an amount of the developer ejected outside the substrate W is reduced.

In the present embodiment, the scan is performed reciprocatedly. However, the scan is performable forward only. In this case, the developing nozzle 3 is moved backward while the discharge is stopped. Moreover, the scan is performable reciprocatedly not only one time but also a plurality of times. Moreover, it is no need to perform the scan reciprocatedly to return to the position 41. Moreover, the scan is performable in such a way so as not to pass over the center C.

Figure 6A:
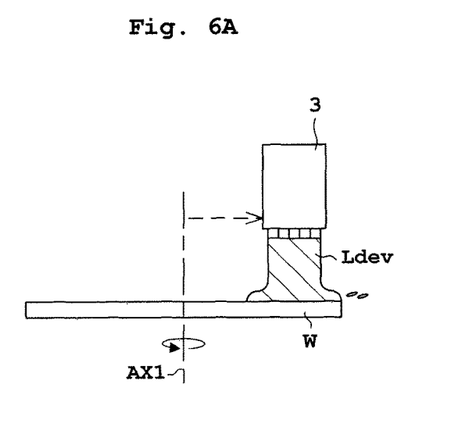
FIGS. 6A and 6B illustrate the main developing step.
Figure 6B:
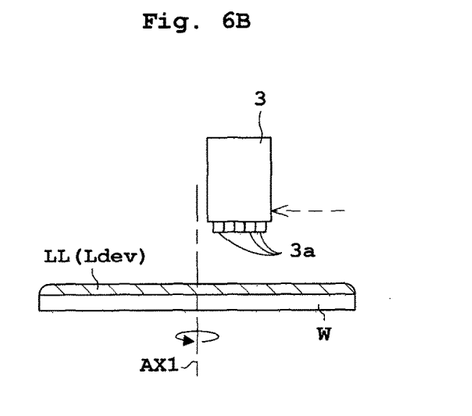

The spin holder 2 further decreases the spinning speed of the substrate W to approximately 30 rpm at a time t7. Consequently, an amount of the developer to be ejected outside the substrate W is further reduced, and thus a liquid layer LL having a given quantity that is formed on the substrate W through spin and a surface tension, as illustrated in FIG. 6B.

The discharge of the developer from the developing nozzle 3 is stopped at a time t8. Here, the substrate W continuously spins, and a given amount of the developer remains on the substrate W. At the time t8, the dissolution product is sufficiently ejected outside the substrate W. A total processing time of the main developing step (t3 to t10) is adjusted until the to the time t10 in such a way to obtain a resist film having desired size patterns.

The spin holder 2 increases the spinning speed of the substrate W to approximately 100 rpm at a time t9. Consequently, a centrifugal force acts on the developer on the substrate W.

The developing nozzle moving unit 11 moves the developing nozzle 3 from the position 41 to the standby position during a period of the times t8 to t10. The rinse nozzle moving unit 15 moves the rinse nozzle 4 from the standby position to a given position above the substrate W. The rinse nozzle moving unit 15 moves the rinse nozzle 4 from the center C of the substrate W to a position 43 set in advance away from the center C by a distance D3 (see FIG. 3).

Figure 6C:
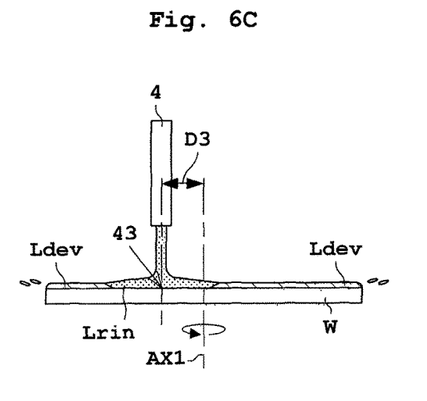
FIGS. 6C and 6D each illustrate a cleaning step.
Figure 6D:
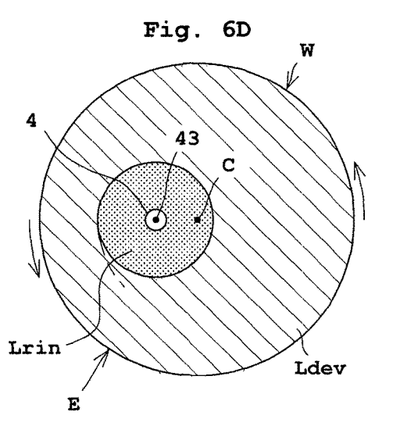

At the cleaning process start time t10, the spin holder 2 further increases the spinning speed of the substrate W to approximately 1000 rpm. Moreover, the rinse nozzle 4 starts discharge of the rinse liquid to the spinning substrate W. That is, as illustrated in FIGS. 6C and 6D, the rinse nozzle 4 starts the discharge of the rinse liquid to the position 43 set in advance and away from the center C of the substrate W. Moreover, the center C is coated with spread of the rinse liquid discharged on the position 43. Consequently, the developer is ejected outside the substrate W, whereas the developer on the substrate W is gradually replaced with the rinse liquid.

The rinse nozzle 4 stops the discharge of the rinse liquid at a time t11. The spin holder 2 further increases the spinning speed of the substrate W to approximately 1800 rpm, thereby removing off the rinse liquid on the substrate W out of the substrate W and drying the substrate W. Then, the spin holder 2 stops spinning of the substrate W at a time t12. The substrate W may be dried by applying inactive gas such as nitrogen to the substrate W.

The developing step is completed in the above manner. Then, the spin holder 2 releases holding of the substrate W. The transporting robot, not shown, transports the substrate W subjected to the developing step.

With the present embodiment, the developing nozzle 3 discharges the developer to the position 41 above the substrate W spinning about the center C and set in advance away from the center C. This allows generation of the developer at the center C with a small centrifugal force immediately after the discharge is started. Accordingly, the dissolution product of the resist can be ejected outside the substrate W more efficiently than the case when the discharge of the developer to the center C is started. In addition, this achieves distributed arrival positions to which the developer directly discharged from the developing nozzle 3 immediately after the discharge is started. Consequently, thin resist patterns especially at the center C of the substrate W are eliminated. As a result, suppression in process variation is obtainable.

Figure 7A:
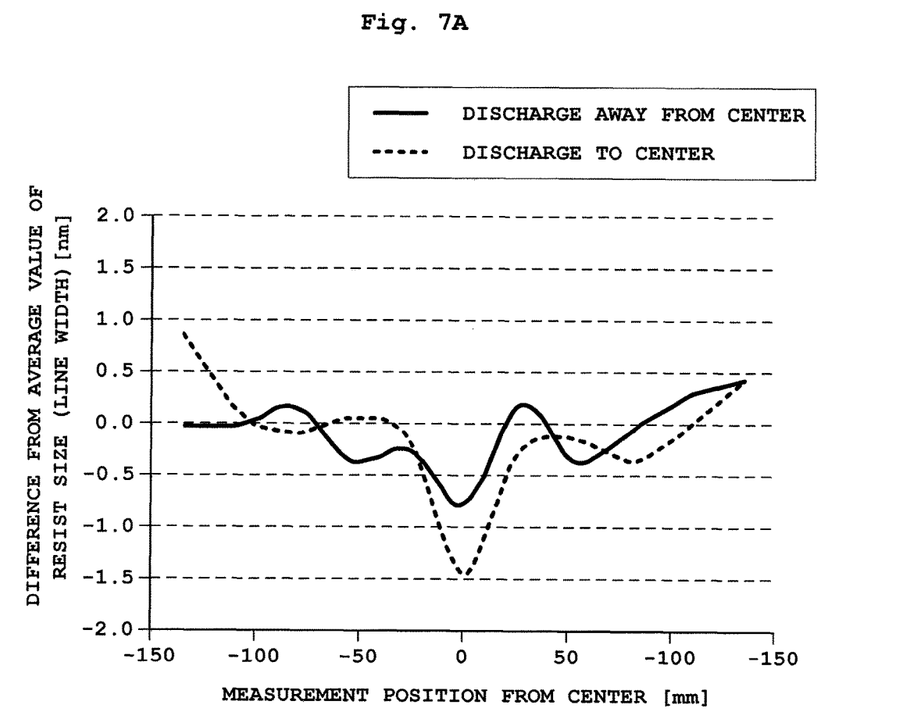
FIG. 7A illustrates comparison in size (line width) of a resist between discharge to the center and discharge outside the center.
Figure 7B:
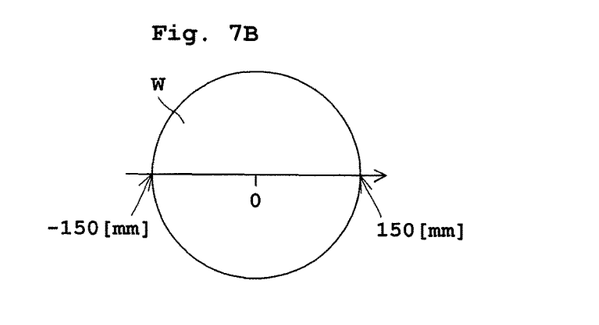
FIG. 7B illustrates a determining position of FIG. 7A.

The following additionally describes effects. FIG. 7A illustrates comparison of the resist size (line width) after the development between when the developer is discharged to the center C and when the developer is discharged to the position 41 away from the center C. Both are under a reciprocated scan. FIG. 7B illustrates a measurement position in FIG. 7A.

FIG. 7A reveals that a resist size at the center C and thereabout is deeply reduced relative to an average value when the developer is discharged to the center C. In contrast to this, a resist size is reduced less deeply when the developer is discharged away from the center C. The resist size within the surface of the substrate W falls within a range (the maximum-the minimum) of 2.3 nm when the developer is discharged to the center C to 1.2 nm when the developer is discharged away from the center C. Here, a variation within the surface ($3\sigma$) is 1.2 nm when the developer is discharged to the center C, and 1.0 nm when the developer is discharged away from the center C. That is, the development differs largely and locally at the center C although there is no significant difference in surface variation.

Moreover, since the center C is coated with spread of the developer discharged on the position 41, the development is performable to the center C although the developer is directly discharged to the position away from the center C.

The center C is coated with the developer, and thereafter the nozzle moving unit 11 moves the developing nozzle 3 toward the outer edge E of the substrate W while the developing nozzle 3 discharges the developer. Here, a position on the substrate W to which the developing nozzle 3 performs direct discharge is moved, whereby a force is applied that is different from the developer flowing due to the centrifugal force. This yields more effective ejection of the dissolution product.

Moreover, the rinse nozzle 4 starts the discharge of the prewet liquid (in the present embodiment, same as the rinse liquid) to the position 42 set in advance on the spinning substrate W away from the center C, and the center C is coated with spread of the prewet liquid discharged on the position 42. The discharge of the developer is started after the discharge of the prewet liquid is stopped.

This allows a flow of the prewet liquid at the center having a small centrifugal force immediately after the prewet liquid is discharged. Accordingly, air bubbles in the prewet liquid can be ejected outside the substrate W more efficiently than the case when the discharge of the prewet liquid to the center C is started. This yields prevention of defective development caused by residual air bubbles. Moreover, the center C is coated with the spread of the prewet liquid discharged on the position 42. This allows a pre-wet treatment to the center C even when the prewet liquid is directly discharged to the position 42 away from the center C.

Moreover, the rinse nozzle 4 starts the discharge of the rinse liquid to the position 43 set in advance on the spinning substrate W away from the center C after the discharge of the developer is stopped, and the center C is coated with the spread of the rinse liquid discharged on the position 43.

This causes a flow of the rinse liquid at the center C having a small centrifugal force immediately after the discharge is started. Accordingly, air bubbles can be ejected outside the substrate W more efficiently than the case when the discharge of the rinse liquid to the center C is started, leading to prevention of an unsatisfactory rinse treatment. Moreover, the center C is coated with the spread of the rinse liquid discharged on the position 43. This yields a rinse treatment to the center C even when the rinse liquid is directly discharged to the position 43 away from the center.

The present invention is not limited to the foregoing examples, but may be modified as follows.

Figure 8:
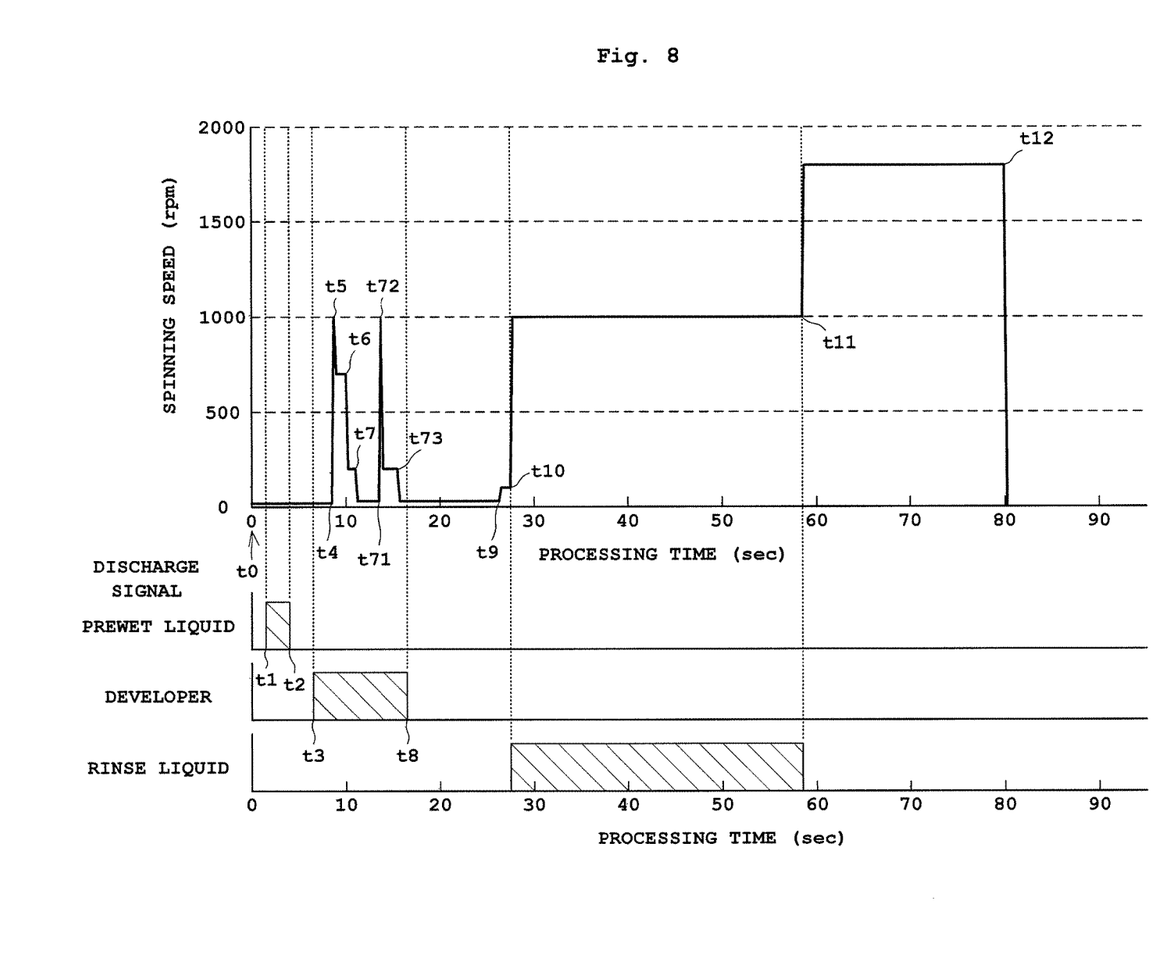
FIG. 8 illustrates a developing step with one example of a spinning speed of a substrate and discharge timings of various types of processing liquid according to one modification of the present invention.

(1) In the embodiment mentioned above, the spinning speed of the substrate W decreases to form the liquid layer LL of the developer on the substrate W, and thereafter the following is performable for reduction of the dissolution product (reduction of the defective development). That is, as illustrated by the times t71 to t73 in FIG. 8, the spinning speed temporarily increases while the developer is discharged to the position 41 set in advance away from the center C, and the liquid layer LL formed on the substrate W is ejected outside the substrate W for forming another liquid layer LL again. Such may be adopted. This operation may be performed one time or a plurality of times. This yields more efficient ejection of the dissolution product of the photoresist outside the substrate W.

(2) In the embodiment and the modification (1) mentioned above, the developing nozzle 3 includes a plurality of discharge ports 3a. However, the number of the discharge ports may be one. Moreover, the discharge ports of the developing nozzle 3 may each have a slit shape.

(3) In the embodiment and the modifications mentioned above, the rinse nozzle 4 includes one discharge port 4a. However, like the developing nozzle 3, the number of discharge ports 4a may be plural (e.g., five).

(4) In the embodiment and the modifications mentioned above, the same type of liquid is used for the rinse liquid and the prewet liquid. However, different types of liquid are used for the rinse liquid and the prewet liquid individually. Moreover, the rinse liquid and the prewet liquid are each discharged through the rinse nozzle 4. However, a plurality of discharge ports 4a are provided, and the rinse liquid and the prewet liquid are discharged through the different discharge ports 4a. Moreover, another nozzle for the prewet liquid is provided other than the rinse nozzle 4 for moving independently from the rinse nozzle 4. Such may be adopted. Moreover, the nozzle may include a plurality of discharge ports for discharging the prewet liquid, the developer, and the rinse liquid individually from the different discharge ports.

(5) In the embodiment and the modifications mentioned above, the prewet liquid is discharged to the position 42, and the rinse liquid is discharged to the position 43. That is, the prewet liquid and the rinse liquid are discharged to the same position. However, such discharge is performable to different positions. Moreover, the prewet liquid and the rinse liquid are discharged while the positions thereof stay. However, a reciprocated scan is performable like the developer. Moreover, the rinse liquid may be scanned together with inactive gas, such as nitrogen, for drying the substrate W.

(6) In the embodiment and the modifications mentioned above, at least one of the prewet liquid, the developer, or the rinse liquid may be discharged to the position set in advance away from the center C. That is, there is no need to perform every discharge to the position away from the center C. Moreover, the pre-processing in FIG. 4 is omittable if the pre-wet processing is not needed. Moreover, the substrate may be processed with the prewet liquid or the rinse liquid singly.

Figure 9:
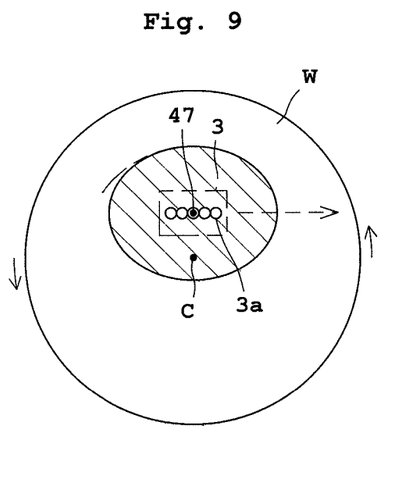
FIG. 9 illustrates a method of performing discharge away from the center according to the modification.

(7) In the embodiment and the modifications mentioned above, the center C is present on an extension line of the discharge ports 3a of the developing nozzle 3, as illustrated in FIG. 3 and FIG. 5D. However, the center C is not necessarily present on the extension line. For instance, as illustrated in FIG. 9, the developing nozzle 3 may be disposed in such a way that the center C is present in a direction orthogonal to a direction of the line. That is, the discharge of the developer may be started to a position away from the center C as in FIG. 9. Then, a scan as illustrated by an arrow in the drawing is performable.

The present invention may be embodied in other specific forms without departing from the spirit or essential attributes thereof and, accordingly, reference should be made to the appended claims, rather than to the foregoing specification, as indicating the scope of the invention.

What is claimed is:

1. A developing method for performing development to a substrate, the developing method comprising:
   a spinning step of spinning the substrate about the center of the substrate with a spin holder;
   a discharge starting step of starting discharge of developer through a developing nozzle to a first position set in advance on the spinning substrate away from the center;
   a coating step of coating the center with spread of the developer discharged on the first position; and
   a moving step of moving the developing nozzle with a nozzle moving unit toward an outer edge of the substrate while the developing nozzle discharges the developer after the coating step of coating the center with the spread of the developer.

2. The developing method according to claim 1, further comprising:
   a discharge starting step of starting discharge of prewet liquid through a prewet nozzle to a second position set in advance on the spinning substrate away from the center; and
   a coating step of coating the center with spread of the prewet liquid discharged on the second position, wherein
   the discharge starting step of starting the discharge of the developer is performed after the discharge of the prewet liquid is stopped.

3. The developing method according to claim 1, further comprising:
   a discharge starting step of starting discharge of rinse liquid through a rinse nozzle to a third position set in advance on the spinning substrate away from the center after the discharge of the developer is stopped; and
   a coating step of coating the center with spread of the rinse liquid discharged on the third position.

4. The developing method according to claim 1, wherein the developing nozzle includes discharge ports arranged in line.

5. The developing method according to claim 1, wherein the developing nozzle includes discharge ports arranged in line.

6. The developing method according to claim 1, wherein a tip of the developing nozzle is positioned away from a surface of the developer spreading over the substrate.

* * * * *